United States Patent
Cho et al.

(10) Patent No.: US 6,682,659 B1
(45) Date of Patent: Jan. 27, 2004

(54) METHOD FOR FORMING CORROSION INHIBITED CONDUCTOR LAYER

(75) Inventors: Ching-Wen Cho, Taipei (TW); Kuwi-Jen Chang, Taipei (TW); Sen-Fu Chen, Taipei (TW); Kuang-Peng Lin, Hsin-chu (TW); Shing-Jzy Tay, Taipei (TW); Szu-Hung Yang, Hsin-chu (TW); Chai-Der Chang, Chia-I (TW); Kuo-Su Huang, Hsin-chu (TW); Jen-Shiang Leu, Hsin-chu (TW); Weng-Liang Fang, Hsinchu (TW); Jyh-Ping Wang, Hsinchu (TW); Jow-Feng Lee, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/435,669

(22) Filed: Nov. 8, 1999

(51) Int. Cl.$^7$ .............................................. H01L 21/311
(52) U.S. Cl. ............................. 216/13; 216/67; 216/77; 216/78; 438/704; 438/710; 438/717
(58) Field of Search ............................. 216/13, 49, 51, 216/57, 67, 75, 77, 78; 438/704, 710, 717

(56) References Cited

U.S. PATENT DOCUMENTS

| | | | |
|---|---|---|---|
| 5,130,224 A | * | 7/1992 | Kawabe et al. ............. 430/165 |
| 5,134,093 A | * | 7/1992 | Onishi et al. ................ 134/1.3 |
| 5,248,384 A | | 9/1993 | Lin et al. .................... 156/643 |
| 5,380,397 A | | 1/1995 | Fukuyama et al. ......... 156/643 |
| 5,380,401 A | | 1/1995 | Jones et al. ................. 156/665 |
| 5,578,163 A | | 11/1996 | Yachi ....................... 156/643.1 |
| 5,595,934 A | | 1/1997 | Kim ............................. 437/180 |
| 5,698,071 A | | 12/1997 | Kawamoto ............... 156/643.1 |
| 5,744,402 A | | 4/1998 | Fukazawa et al. .......... 438/734 |
| 5,776,832 A | * | 7/1998 | Hsieh et al. ................. 438/669 |
| 5,854,134 A | * | 12/1998 | Lan et al. .................... 438/695 |
| 5,888,309 A | * | 3/1999 | Yu .............................. 134/1.2 |
| 6,006,764 A | * | 12/1999 | Chu et al. .................... 134/1.2 |
| 6,130,167 A | * | 10/2000 | Tao et al. .................... 438/618 |

* cited by examiner

Primary Examiner—Allan Olsen
(74) Attorney, Agent, or Firm—George O. Saile; Stephen B. Ackerman; Stephen G. Stanton

(57) ABSTRACT

A method for passivating a target layer. There is first provided a substrate. There is then formed over the substrate a target layer, where the target layer is susceptible to corrosion incident to contact with a corrosive material employed for further processing of the substrate. There is then treated, while employing a first plasma method employing a first plasma gas composition comprising an oxidizing gas, the target layer to form an oxidized target layer having an inhibited susceptibility to corrosion incident to contact with the corrosive material employed for further processing of the substrate. Finally, there is then processed further, while employing the corrosive material, the substrate. The method is useful when forming bond pads within microelectronic fabrications. When directed towards forming patterned conductor layers, such as bond pads, the method optionally employs an inert plasma treatment of a patterned conductor layer followed by an aqueous ethanolamine treatment of the patterned conductor layer prior to a first plasma treatment of the patterned conductor layer.

16 Claims, 4 Drawing Sheets

METHOD FOR FORMING CORROSION INHIBITED CONDUCTOR LAYER

CROSS-REFERENCE TO RELATED APPLICATIONS

This application is related to co-assigned: (1) application Ser. No. 09/252,465, filed Feb. 18, 1999, titled "Color Filter Image Array Optoelectronic Microelectronic Fabrication With Three Dimensional Color Filter Layer and Method for Fabrication Thereof" now U.S. Pat. No. 6,200,712, (2) application Ser. No. 09/252,466, filed Feb. 18, 1999, now U.S. Pat. No. 6,168,966, titled "Uniform Areal Sensitivity Image Array", and (3) application Ser. No. 09/252,467, filed Feb. 18, 1999, now U.S. Pat. No. 6,177,883 titled "Image Array Optoelectronic Microelectronic Fabrication With Enhanced Optical Stability and Method for Fabrication Thereof," the teachings of all of which related co-assigned applications are incorporated herein fully by reference.

BACKGROUND OF THE INVENTION

1. Field of the Invention

The present invention relates generally to methods for forming conductor layers within microelectronic fabrications. More particularly, the present invention relates to methods for forming corrosion inhibited conductor layers, optionally with enhanced bondability, within microelectronic fabrications.

2. Description of the Related Art

Microelectronic fabrications are formed from microelectronic substrates over which are formed patterned microelectronic conductor layers which are separated by microelectronic dielectric layers.

In the process of forming patterned microelectronic conductor layers for use within microelectronic fabrications, and in particular in the process of forming patterned terminal microelectronic conductor layers for use within microelectronic fabrications, from which patterned terminal microelectronic conductor layers are formed bond pads within microelectronic fabrications, it is desirable to assure that such patterned microelectronic conductor layers, and in particular such patterned terminal microelectronic conductor layers, are formed in a fashion such that there is inhibited corrosion when both forming and subsequently processing those patterned microelectronic conductor layers. Inhibited corrosion when forming and subsequently processing patterned microelectronic conductor layers within microelectronic fabrications is desirable insofar as there is typically formed more fully functional and reliable connections within microelectronic fabrications to patterned microelectronic conductor layers with inhibited corrosion.

It is thus towards the goal of forming within microelectronic fabrications microelectronic conductor layers with inhibited corrosion that the present invention is directed.

Various methods have been disclosed in the art of microelectronic fabrication for forming microelectronic conductor layers, including patterned terminal microelectronic conductor layers from which may be formed bond pads within microelectronic fabrications, with desirable properties within microelectronic fabrications.

For example, Lin et al., in U.S. Pat. No. 5,248,384, disclose a method for forming within a microelectronic fabrication a void free aluminum containing conductor layer which has been exposed to an oxygen containing plasma incident to employing the oxygen containing plasma for stripping a photoresist layer in the presence of the aluminum containing conductor layer within the microelectronic fabrication. The method employs, after the oxygen containing plasma stripping of the photoresist layer in the presence of the aluminum containing conductor layer, a rapid thermal annealing of the aluminum containing conductor layer at a temperature of from about 400 to about 550 degrees centigrade to provide the aluminum containing conductor layer void free.

In addition, Fukuyama et al., in U.S. Pat. No. 5,380,397, disclose a plasma etch method for forming within a microelectronic fabrication a patterned aluminum containing conductor layer with inhibited corrosion. The plasma etch method employs: (1) a halogen containing etchant gas composition for etching the patterned aluminum containing conductor layer from a corresponding blanket aluminum containing conductor layer; followed by (2) a hydrogen and oxygen containing etchant gas composition for simultaneously stripping from the patterned aluminum containing conductor layer: (a) a patterned photoresist layer employed in defining the patterned aluminum containing conductor layer; and (b) halogen residues which would otherwise facilitate corrosion of the patterned aluminum containing conductor layer.

Further, Jones et al., in U.S. Pat. No. 5,380,401, disclose a plasma etch method for removing from an aluminum containing conductor layer bond pad within a microelectronic fabrication a fluorine containing plasma etch residue formed incident to etching a silicon containing dielectric passivation layer formed over the aluminum containing conductor layer bond pad to form a via accessing the aluminum containing conductor layer bond pad. The plasma etch method employs an argon etchant gas, in conjunction with an optional carbon dioxide carrier gas, to etch from the aluminum containing conductor layer bond pad within the microelectronic fabrication the fluorine containing plasma etch residue.

Still further, Yachi, in U.S. Pat. No. 5,578,163, discloses a plasma etch method for forming within a microelectronic fabrication a sidewall residue free patterned aluminum containing conductor layer with inhibited corrosion of the sidewall residue free patterned aluminum containing conductor layer. The plasma etch method employs: (1) a first plasma employing a chlorine containing etchant gas for forming the patterned aluminum containing conductor layer from a corresponding blanket aluminum containing conductor layer, where the patterned aluminum containing conductor layer so formed has a sidewall residue layer formed thereupon; (2) a second plasma employing a hydrogen containing etchant gas composition for removing from the patterned aluminum containing conductor layer a chlorine containing residue formed incident to use of the first plasma; and (3) a third plasma employing an oxygen containing etchant gas composition for removing from the patterned aluminum containing conductor layer a patterned photoresist layer employed in defining the patterned aluminum containing conductor layer, where the second plasma and the third plasma are employed under temperature conditions such that the sidewall residue layer is not hardened and thus may be readily subsequently stripped.

Yet still further, Kim, in U.S. Pat. No. 5,595,934, discloses a method for inhibiting corrosion of an aluminum containing conductor layer bond pad within a microelectronic fabrication. The method employs forming upon the aluminum containing conductor layer bond pad an aluminum oxide coating while employing a simultaneous exposure of the aluminum containing conductor layer bond pad to ozone and ultraviolet radiation.

Analogously with Fukuyama et al., as cited above, Kawamoto, in U.S. Pat. No. 5,698,071, also discloses a plasma etch method for stripping from a patterned aluminum containing conductor layer formed within a microelectronic fabrication while employing a chlorine containing etchant gas composition a patterned photoresist layer employed in defining the patterned aluminum containing conductor layer while employing the chlorine containing etchant gas composition, while similarly inhibiting corrosion of the patterned aluminum containing conductor layer. The plasma etch method sequentially employs: (1) a first plasma employing an etchant gas composition comprising a substance having at least one of hydrogen and hydroxyl for stripping from the patterned aluminum containing conductor layer a chlorine containing residue which would otherwise corrode the patterned aluminum containing conductor layer, followed by; (2) a second plasma employing a second etchant gas composition comprising an oxygen containing etchant gas composition for stripping from the patterned aluminum containing conductor layer the patterned photoresist layer, wherein by employing the first plasma etch method and the second plasma etch method sequentially, there is provided process efficiency within the aggregate plasma etch method.

Finally, Fukazawa et al., in U.S. Pat. No. 5,744,402, disclose a method for forming within a microelectronic fabrication a residue free patterned layer while employing a plasma etch method, where the residue free patterned layer formed employing the plasma etch method may be a residue free patterned aluminum containing conductor layer formed employing a chlorine containing plasma etch method. The method employs, subsequent to the plasma etch method, a stripping of plasma etch residues from the patterned layer, such as the patterned aluminum containing conductor layer, while employing hydrofluoric acid vapor at a temperature of greater than about 40 degrees centigrade.

Desirable in the art of microelectronic fabrication are additional methods and materials which may be employed to form within microelectronic fabrications microelectronic conductor layers with inhibited corrosion.

It is towards that goal that the present invention is directed.

SUMMARY OF THE INVENTION

A first object of the present invention is to provide a method for forming a microelectronic conductor layer within a microelectronic fabrication.

A second object of the present invention is to provide a method in accord with the first object of the present invention, where the microelectronic conductor layer is formed with inhibited corrosion.

A third object of the present invention is to provide a method in accord with the first object of the present invention and the second object of the present invention, which method is readily commercially implemented.

In accord with the objects of the present invention, there is provided by the present invention a method for passivating a target layer. To practice the method of the present invention, there is first provided a substrate. There is then formed over the substrate a target layer, where the target layer is susceptible to corrosion incident to contact with a corrosive material employed for further processing of the substrate. There is then treated, while employing a first plasma method employing a first plasma gas composition comprising an oxidizing gas, the target layer to form an oxidized target layer having an inhibited susceptibility to corrosion incident to contact with the corrosive material employed for further processing of the substrate. Finally, there is then further processed, while employing the corrosive material, the substrate. Within the method of the present invention, the target layer may be a microelectronic conductor layer, such as but not limited to a patterned aluminum containing microelectronic conductor layer.

The present invention provides a method for forming a microelectronic conductor layer within a microelectronic fabrication, where the microelectronic conductor layer is formed with inhibited corrosion. The method of the present invention realizes the foregoing object by first forming over a substrate which may be employed within a microelectronic fabrication a target layer, where the target layer may be a patterned aluminum containing microelectronic conductor layer which is susceptible to corrosion incident to contact with a corrosive material employed for further processing of the substrate. There is then treated, while employing a first plasma method employing a first plasma gas composition comprising an oxidizing gas, the target layer to form an oxidized target layer having an inhibited susceptibility to corrosion incident to contact with the corrosive material employed for further processing of the substrate, prior to further processing, while employing the corrosive material, of the substrate.

The method of the present invention is readily commercially implemented. The present invention employs methods and materials as are generally known in the art of microelectronic fabrication. Since it is a process ordering and a process control which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

Figure 1:
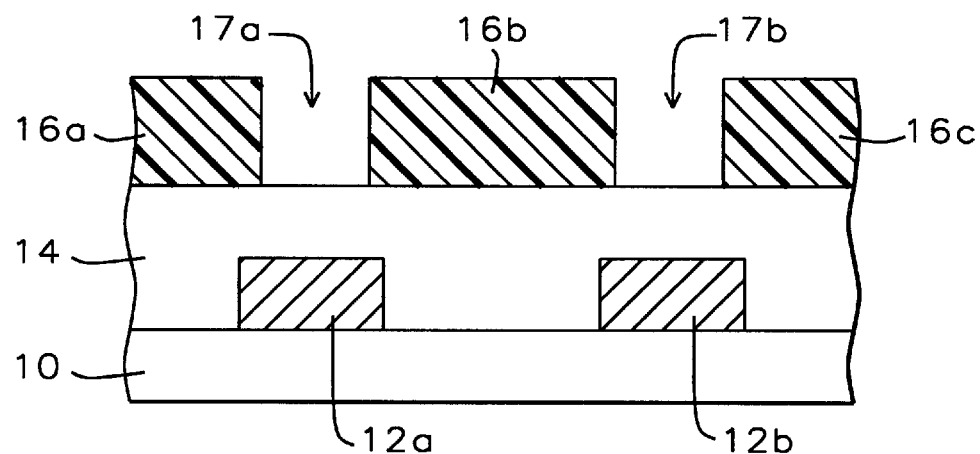
FIG. 1, FIG. 2, FIG. 3, FIG. 4, FIG. 5 and FIG. 6 show a series of schematic cross-sectional diagrams illustrating the results of forming, in accord with a preferred embodiment of the present invention, a pair of vias accessing a pair of patterned microelectronic conductor layers within a microelectronic fabrication.

The present invention provides a method for forming a patterned aluminum containing conductor layer within a microelectronic fabrication, where the patterned aluminum containing conductor layer is formed with inhibited corrosion. The method of the present invention realizes the foregoing object by first forming over a substrate which may be employed within a microelectronic fabrication a target layer, which may be a patterned aluminum containing conductor layer, where the target layer is susceptible to corrosion incident to contact with a corrosive material employed for further processing of the substrate. There is then treated, while employing a first plasma method employing a first plasma gas composition comprising an oxidizing gas, the target layer to form an oxidized target layer having an inhibited susceptibility to corrosion incident to contact with the corrosive material employed for further processing of the substrate, prior to further processing, while employing the corrosive material, of the substrate.

Although the preferred embodiment of the present invention illustrates, in part, the present invention within the context of forming a pair of vias accessing a pair of patterned conductor layers within a microelectronic fabrication while inhibiting corrosion of the pair of patterned conductor layers within the microelectronic fabrication, in a more general sense, the method of the present invention may be employed for processing within the presence of a target layer within a microelectronic fabrication a substrate, where the substrate is processed employing a corrosive material which is corrosive to the target layer formed within the microelectronic fabrication. The present invention realizes the foregoing object by first oxidizing the target layer to form an oxidized target layer with inhibited susceptibility to corrosion within the corrosive material employed for further processing of the substrate, prior to further processing of the substrate while employing the corrosive material. Although from a practical perspective the present invention provides most value when the target layer is a patterned conductor layer, such as a patterned aluminum containing conductor layer, other combinations of materials for forming the target layer, in conjunction with particular corrosive materials, are not precluded within the present invention. Thus, the target layer may be formed from microelectronic materials including but not limited to microelectronic conductor materials, microelectronic semiconductor materials and (to the extent that corrosion and corrosive material induced erosion are related phenomena) microelectronic dielectric materials.

Finally, the method of the present invention may be employed for forming with inhibited corrosion target layers within microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Referring now to FIG. 1 to FIG. 6, there is shown a series of schematic cross-sectional diagrams illustrating the results of forming within a microelectronic fabrication in accord with a preferred embodiment of the present invention a pair of vias accessing a pair of patterned conductor layers, with inhibited corrosion of the pair of patterned conductor layers. Shown in FIG. 1 is a schematic cross-sectional diagram of the microelectronic fabrication at an early stage in its fabrication in accord with the present invention.

Shown in FIG. 1 is a substrate 10 having formed thereupon a pair of patterned conductor layers 12a and 12b which are further encapsulated by a blanket dielectric passivation layer 14. The blanket dielectric passivation layer 14 in turn has formed thereupon a series of patterned photoresist layers 16a, 16b and 16c which defines a pair of apertures 17a and 17b positioned above the pair of patterned conductor layers 12a and 12b. Each of the foregoing layers and structures may be formed employing methods and materials as are conventional in the art of microelectronic fabrication.

For example, the substrate 10 may be a substrate employed in fabricating a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated within the schematic cross-sectional diagram of FIG. 1, the substrate 10 may be a substrate alone as employed in fabricating the microelectronic fabrication, or in the alternative, the substrate 10 may be the substrate employed in fabricating the microelectronic fabrication, where the substrate has formed thereupon and/or therover, and thus incorporated therein, any of several additional layers as are conventional in fabricating the microelectronic fabrication within which is employed the substrate. Such additional microelectronic layers may, similarly with the substrate, be formed employing microelectronic materials selected from the group including but not limited to microelectronic conductor materials, microelectronic semiconductor materials and microelectronic dielectric materials.

Similarly, although also not illustrated within the schematic cross-sectional diagram of FIG. 1, the substrate 10, particularly but not exclusively when the substrate 10 is a semiconductor substrate employed within a semiconductor integrated circuit microelectronic fabrication, typically and preferably has formed therein and/or thereupon microelectronic devices as are conventional within the microelectronic fabrication within which is employed the substrate 10. Such microelectronic devices may include, but are not limited to resistors, transistors, diodes and capacitors.

Within the preferred embodiment of the present invention with respect to the pair of patterned conductor layers 12a and 12b, although, as noted above, in general within the method of the present invention a pair of patterned target layers, such as the pair of patterned conductor layers 12a and 12b, may be formed of microelectronic materials including but not limited to microelectronic conductor materials, microelectronic semiconductor materials and microelectronic dielectric materials, given the proviso that the pair of patterned target layers is susceptible to corrosion incident to contact with a corrosive material which is employed for further processing of a microelectronic fabrication derived from the microelectronic fabrication whose schematic cross-sectional diagram is illustrated in FIG. 1, the pair of patterned conductor layers 12a and 12b is typically and preferably formed of a conductor material, such as but not limited to a metal conductor material, a metal alloy conductor material or a composite conductor material comprising a metal conductor material and/or a metal alloy conductor material, and more particularly an aluminum, an aluminum alloy, a copper or a copper alloy conductor material. Within the preferred embodiment of the present invention, there may also optionally be employed formed co-extensively beneath and/or above the pair of patterned conductor layers 12a and 12b a corresponding pair of patterned lower barrier layers or patterned upper barrier layers. Within the preferred embodiment of the present invention, the upper surface of the substrate 10 is typically and preferably formed of a silicon containing dielectric layer such as but not limited to a silicon oxide dielectric layer, a silicon nitride dielectric layer or a silicon oxynitride dielectric layer, and each of the patterned conductor layers 12a and 12b is formed thereupon to a thickness of from about 4000 to about 9000 angstroms and a linewidth of from about 80 to about 90 microns, while being separated by a pitch dimension of from about 10 to about 20 microns.

Within the preferred embodiment of the present invention with respect to the blanket dielectric passivation layer 14, the blanket dielectric passivation layer 14 is preferably formed employing a silicon containing dielectric passivation material as is conventional in the art of microelectronic fabrication. Such silicon containing dielectric passivation materials may be selected from the group including but not limited to silicon oxide dielectric passivation materials, silicon nitride dielectric passivation materials, silicon oxynitride dielectric passivation materials and composites thereof, formed employing methods including but not limited to chemical vapor deposition (CVD) methods, plasma enhanced chemical vapor deposition (PECVD) methods and physical vapor deposition (PVD) methods. Typically and preferably, the blanket dielectric passivation layer 14 is formed to a thickness of from about 8000 to about 20000 angstroms encapsulating the pair of patterned conductor layers 12a and 12b and exposed portions of the substrate 10.

Finally, within the preferred embodiment of the present invention with respect to the series of patterned photoresist layers 16a, 16b and 16c, the series of patterned photoresist layers 16a, 16b and 16c may be formed employing photoresist materials as are conventional in the art of microelectronic fabrication, such photoresist materials being selected from the general groups of photoresist materials including but not limited to positive photoresist materials and negative photoresist materials. Typically and preferably, the series of patterned photoresist layers 16a, 16b and 16c is formed upon the blanket dielectric passivation layer 14 to a thickness of from about 8000 to about 20000 angstroms each, while defining the pair of apertures 17a and 17b.

Figure 2:
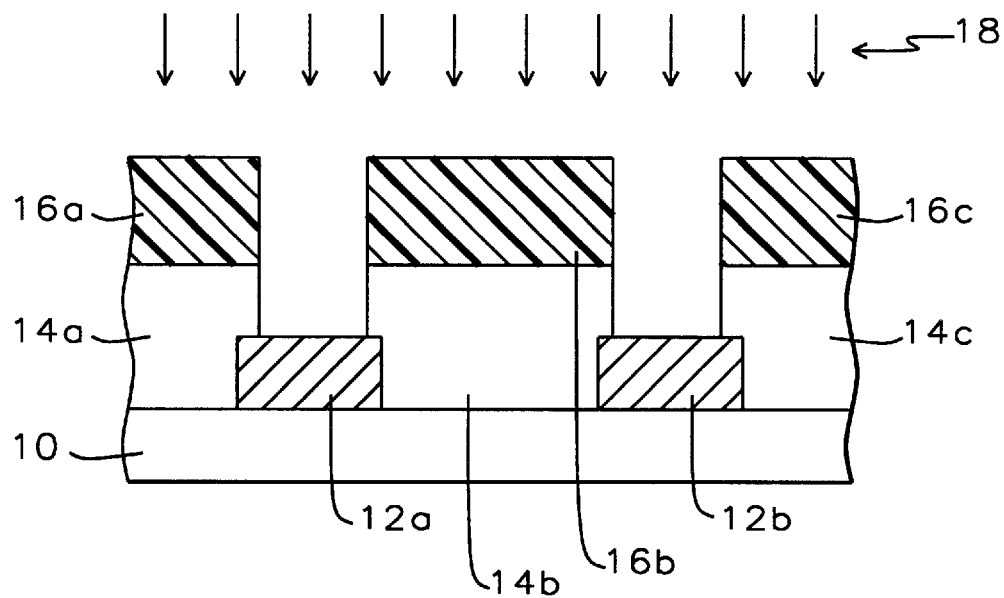

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated in FIG. 1, but wherein the blanket dielectric passivation layer 14 has been patterned to form a series of patterned dielectric passivation layers 14a, 14b and 14c, while employing the series of patterned photoresist layers 16a, 16b and 16c as a series of etch mask layers, in conjunction with an etching plasma 18.

Within the preferred embodiment of the present invention, the etching plasma 18 employs an etchant gas composition appropriate to the material from which is formed the blanket dielectric passivation layer 14. Within the preferred embodiment of the present invention where the blanket dielectric passivation layer 14 is formed of a silicon containing dielectric material, the etching plasma 18 will typically and preferably employ an etchant gas composition which upon plasma activation forms an active fluorine containing etchant species. Typically and preferably, such an etchant gas composition employs an etchant gas selected from the group consisting of perfluorocarbons, hydrofluorocarbons, sulfur hexafluoride and nitrogen trifluoride.

Within the preferred embodiment of the present invention, the etching plasma 18 more preferably employs an etchant gas composition comprising carbon tetrafluoride and argon. When etching the blanket dielectric passivation layer 14 formed upon an eight inch diameter substrate 10, the etching plasma 18 preferably also employs: (1) a reactor chamber pressure of from about 0.15 to about 0.40 torr; (2) a radio frequency source power of from about 400 to about 800 watts at a source radio frequency of 13.56 MHZ; (3) a substrate 10 temperature of from about −5 to about +5 degrees centigrade; (4) a carbon tetrafluoride flow rate of from about 20 to about 90 standard cubic centimeters per minute (sccm); and (5) an argon flow rate of from about 120 to about 300 standard cubic centimeters per minute (sccm). Preferably, the etching plasma 18 is employed for a sufficient etching time to completely clear the surfaces of the patterned conductor layers 12a and 12b, which although not specifically illustrated within the schematic cross-sectional diagram of FIG. 2 will generally require some over-etching of the patterned conductor layers 12a and 12b.

Figure 3:
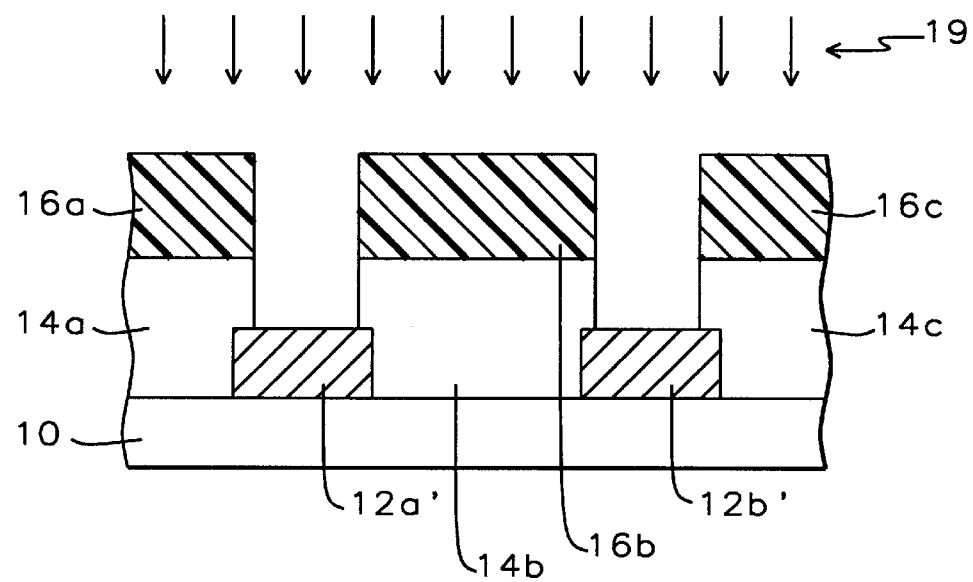

Referring now to FIG. 3, there is shown a schematic cross-sectional diagram illustrating the results of further processing of the microelectronic fabrication whose schematic cross-sectional diagram is illustrated in FIG. 2.

Shown in FIG. 3 is a schematic cross-sectional diagram of a microelectronic fabrication otherwise equivalent to the microelectronic fabrication whose schematic cross-sectional diagram is illustrated in FIG. 2, but wherein the pair of patterned conductor layers 12a and 12b has been treated with an inert plasma 19 to form a pair of inert plasma treated patterned conductor layers 12a' and 12b'. Within the present invention, the pair of patterned conductor layers 12a and 12b is optionally treated with the inert plasma 19 to form the pair of inert plasma treated patterned conductor layers 12a' and 12b' primarily, but not exclusively, under conditions where the pair of patterned conductor layers is at least in part formed of an aluminum containing conductor material, and where the etching plasma employs a fluorine containing etchant gas composition. Under such circumstances, in the absence of the inert plasma 19 treatment of the pair of patterned conductor layers 12a and 12b when forming the pair of inert plasma treated patterned conductor layers 12a' and 12b', there is typically experimentally observed enhanced crystalline defect formation and enhanced pit formation within the pair of patterned conductor layers 12a and 12b after exposure to the etching plasma 18.

While not wishing to be bound to any particular theory as to why the inert plasma 19 treatment of the pair of patterned conductor layers 12a and 12b as illustrated within the schematic cross-sectional diagram of FIG. 2 provides the pair of inert plasma treated patterned conductor layers 12a' and 12b' with attenuated crystalline defect formation and attenuated pit formation, it is believed that such inert plasma 19 treatment removes residual fluorine materials entrained within the patterned conductor layers 12a and 12b incident to exposure to the etching plasma 18 when the etching plasma 18 comprises a fluorine containing etchant gas. Such fluorine materials, particularly incident to exposure to ambient humidity, are believed to provide reaction products which contribute to crystalline defect formation, pit formation and possibly also corrosion, of the patterned conductor layers 12a and 12b.

Although any of several inert gases may be employed when forming the inert plasma 19, including but not limited to helium, neon, argon and krypton inert gases, for the preferred embodiment of the present invention, the inert plasma preferably comprises argon, more preferably, the inert plasma consists essentially of argon. When employing the inert plasma 19 to treat the pair of patterned conductor layers 12a and 12b when forming the pair of inert plasma treated patterned conductor layers 12a' and 12b' upon an eight inch diameter substrate, the inert plasma also preferably employs: (1) a reactor chamber pressure of from about 300 to about 500 mtorr; (2) a radio frequency power of from about 1300 to about 1600 watts, without a bias power; (3) a substrate 10 temperature of from about 50 to about 140 degrees centigrade controlled by a backside helium cooling pressure of from about 10 to about 15 torr; (4) an argon flow rate of from about 350 to about 550 standard cubic centimeters per minute (sccm); and (5) a treatment time of from about 20 to about 60 seconds.

Although FIG. 3 illustrates the use of the inert plasma 19 to form from the pair of patterned conductor layers 12a and 12b the pair of inert plasma treated patterned conductor layers 12a' and 12b', as an alternative to, or as an adjunct with, the inert plasma 19, there may also be employed within the present invention an aqueous ammonium hydroxide and hydrogen peroxide solution treatment of the patterned conductor layers 12a and 12b as illustrated in FIG. 2 such that upon treatment with the aqueous ammonium hydroxide and hydrogen peroxide solution the pair of patterned conductor layers 12a and 12b so treated also exhibits less susceptibility to crystalline defect formation and pit formation.

Typically and preferably, the aqueous ammonium hydroxide and hydrogen peroxide solution is employed at: (1) a 28% aqueous ammonium hydroxide:30% aqueous hydrogen peroxide:deionized water volume ratio of from about 1:1:5 to about 1:4:20; (2) a temperature of from about 20 to about 50 degrees centigrade; and (3) an exposure time of from about 0.5 to about 7 minutes. For aqueous ammonium hydroxide and hydrogen peroxide exposure times of greater than about 3 minutes, it is desirable within the method of the present invention to provide an inert plasma treatment (in accord with the above parameters) after the aqueous ammonium hydroxide and hydrogen peroxide exposure. Such process ordering has been observed to provide enhanced bondability to the pair of patterned conductor layers 12a and 12b.

While not wishing to be bound to any particular theory as to why crystalline defect formation and pit formation of the patterned conductor layers 12a and 12b is attenuated upon treatment with an aqueous ammonium hydroxide and hydrogen peroxide solution, it is believed that aqueous ammonium hydroxide reacts with aluminum fluoride formed incident to overetching of aluminum within the patterned conductor layers 12a and 12b to thus form ammonium fluoride which is soluble in aqueous media, as well as aluminum hydroxide which may eventually be dehydrated to form an aluminum oxide coating upon the patterned conductor layers 12a and 12b.

Figure 4:
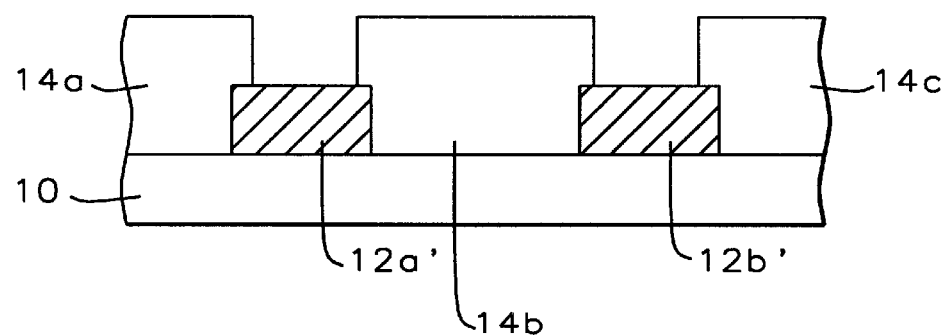

Referring now to FIG. 4, there is shown a schematic cross-sectional diagram illustrating the results of further processing of the microelectronic fabrication whose schematic cross-sectional diagram is illustrated in FIG. 3.

Shown in FIG. 4 is a schematic cross-sectional diagram of a microelectronic fabrication otherwise equivalent to the microelectronic fabrication whose schematic cross-sectional diagram is illustrated in FIG. 3, but wherein the series of patterned photoresist layers 16a, 16b and 16c has been stripped from the series of patterned dielectric passivation layers 14a, 14b and 14c. Although any of several possible photoresist stripping materials may be employed for stripping from the series of patterned dielectric passivation layers 14a, 14b and 14c the series of patterned photoresist layers 16a, 16b and 16c, within the present invention the series of patterned photoresist layers 16a, 16b and 16c is preferably stripped from the series of patterned dielectric passivation layers 14a, 14b and 14c while employing a photoresist stripper material appropriate for the photoresist material from which is formed the patterned photoresist layers 16a, 16b and 16c. Such photoresist stripper materials may include, but are not limited to wet chemical photoresist stripper methods and materials and conventional low density plasma photoresist stripper methods and materials. Within the context of the present invention, "low density plasma" photoresist stripper methods and materials are intended primarily as oxygen containing plasma stripping methods and materials which employ a negative substrate bias (i.e. about −240 volts), and are otherwise typically employed at a radio frequency plasma power of from about 800 to about 1200 watts.

As is understood by a person skilled in the art, although the preferred embodiment of the present invention illustrates forming from the pair of patterned conductor layers 12a and 12b the pair of inert plasma treated patterned conductor layers 12a' and 12b' prior to stripping from the series of patterned dielectric passivation layers 14a, 14b and 14c the series of patterned photoresist layers 16a, 16b and 16c, a reverse ordering of the preceding two process steps is also contemplated within the present invention.

Although not specifically illustrated within the schematic cross-sectional diagram of FIG. 3, there is then optionally, but preferably, treated the microelectronic fabrication whose schematic cross-sectional diagram is illustrated within FIG. 3 with an aqueous ethanolamine stripper material. Such an aqueous ethanolamine stripper material is available from EKC Corporation or Ashland Chemical Technology (ACT) Corporation and will typically and preferably comprise ethanolamine, along with minor but beneficial concentrations of suitable surfactants and stabilizers. It is also important to the present invention that the aqueous ethanolamine stripper material, which may also simultaneously comprise a wet chemical stripper which is employed for stripping the series of patterned photoresist layers 16a, 16b and 16c from the patterned dielectric passivation layers 14a, 14b and 14c, also substantially strips any organic residue layers and related contamination, such as but not limited to particulate contamination, from the surfaces of the inert plasma treated patterned conductor layers 12a' and 12b', as well as other related and unrelated portions of the microelectronic fabrication whose schematic cross-sectional diagram is illustrated in FIG. 3. Under conditions where the aqueous ethanolamine stripper material is employed, at least in part, to strip the series of patterned photoresist layers 16a, 16b and 16c from the series of patterned dielectric passivation layers 14a, 14b and 14c, it is preferred within the preferred embodiment of the present invention that the pair of patterned conductor layers 12a and 12b is treated with the inert plasma 19 to form the pair of inert plasma treated patterned conductor layers 12a' and 12b' prior to stripping the series of patterned photoresist layers 16a, 16b and 16c from the series of patterned dielectric passivation layers 14a, 14b and 14c.

Figure 5:
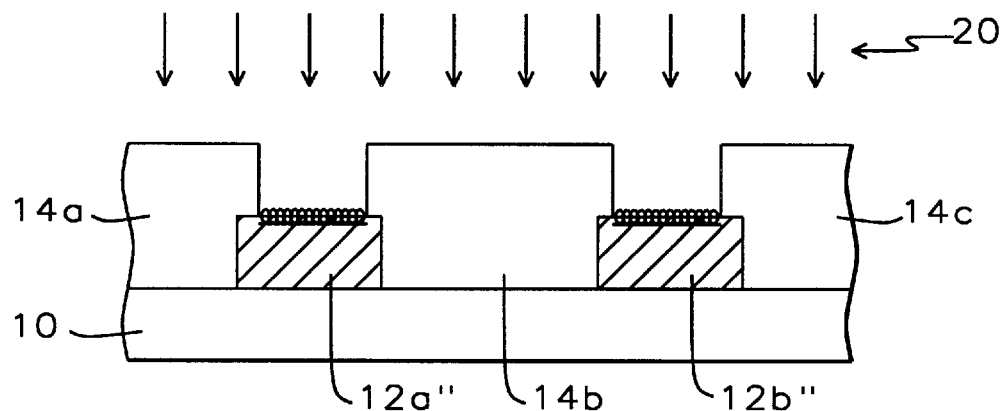

Referring now to FIG. 5, there is shown a schematic cross-sectional diagram illustrating the results of further processing of the microelectronic fabrication whose schematic cross-sectional diagram is illustrated in FIG. 4. Shown in FIG. 5 is a schematic cross-sectional diagram of a microelectronic fabrication otherwise equivalent to the microelectronic fabrication whose schematic cross-sectional diagram is illustrated in FIG. 4, but wherein the pair of inert plasma treated patterned conductor layers 12a' and 12b' has been oxidized to form a corresponding pair of oxidized inert plasma treated patterned conductor layers 12a" and 12b", while employing a first oxidizing plasma 20.

Within the preferred embodiment of the present invention, the first oxidizing plasma 20 may employ an oxidizing gas selected from the group including but not limited to oxygen, ozone, nitrous oxide and nitric oxide, along with suitable diluents to effect proper stabilization of the first oxidizing plasma 20. Preferably, the first oxidizing plasma 20 employs an oxygen oxidizing gas. Preferably, the first oxidizing plasma 20 also employs, when oxidizing the pair of inert plasma treated patterned conductor layers 12a' and 12b' to form the pair of oxidized inert plasma treated patterned conductor layers 12a" and 12b" upon an eight inch diameter substrate 10: (1) a reactor chamber pressure of from about 0.5 to about 0.8 torr; (2) a radio frequency source power of from about 500 to about 700 watts at a source radio frequency of 13.56 MHz; (3) a substrate 10 temperature of from about 100 to about 200 degrees centigrade; and (3) an oxygen flow rate of about 450 to about 600 standard cubic centimeters per minute (sccm). Typically and preferably, the pair of inert plasma treated patterned conductor layers 12a' and 12b' is treated with the first oxidizing plasma 20 for a time period of from about 1800 to about 4200 seconds to form the pair of oxidized inert plasma treated patterned conductor layers 12a" and 12b" having a surface oxide layer of thickness about 20 to about 50 angstroms. Within the preferred embodiment of the present invention, the first oxidizing plasma 20 is not formed while deliberately employing conditions which are intended to provide particularly enhanced concentrations of ozone or ultraviolet radiation when oxidizing the pair of inert plasma treated patterned conductor layers 12a' and 12b' to form the pair of oxidized inert plasma treated patterned conductor layers 12a" and 12b".

While the schematic cross-sectional diagrams of FIG. 4 and FIG. 5 illustrate in part a sequential treatment of the microelectronic fabrication whose schematic cross-sectional diagram is illustrated within FIG. 4 with an aqueous ethanolamine stripper composition followed by an oxidizing plasma oxidation of the pair of inert plasma treated patterned conductor layers 12a' and 12b' to form the pair of oxidized inert plasma treated patterned conductor layers 12a" and 12b" as illustrated within the schematic cross-sectional diagram of FIG. 5, in a first instance, the present invention relies primarily upon oxidation within the first oxidizing plasma 20 of the pair of inert plasma treated patterned conductor layers 12a' and 12b' to form the pair of oxidized inert plasma treated patterned conductor layers 12a" and 12b". Thus, under circumstances within the present invention where an aqueous ethanolamine treatment of the microelectronic fabrication whose schematic cross-sectional diagram is illustrated in FIG. 4 is not undertaken, or where an aqueous ethanolamine treatment will not strip the series of patterned photoresist layers 16a, 16b and 16c when the series of patterned photoresist layers 16a, 16b and 16c has not otherwise been stripped from the microelectronic fabrication whose schematic cross-sectional diagram is illustrated in FIG. 3, the first oxidizing plasma 20 which is employed in oxidizing the pair of inert plasma treated patterned conductor layers 12a' and 12b' to form the pair of oxidized inert plasma treated patterned conductor layers 12a" and 12b" may also at least in part strip the series of patterned photoresist layers 16a, 16b and 16c from the series of patterned dielectric passivation layers 14a, 14b and 14c.

Figure 6:
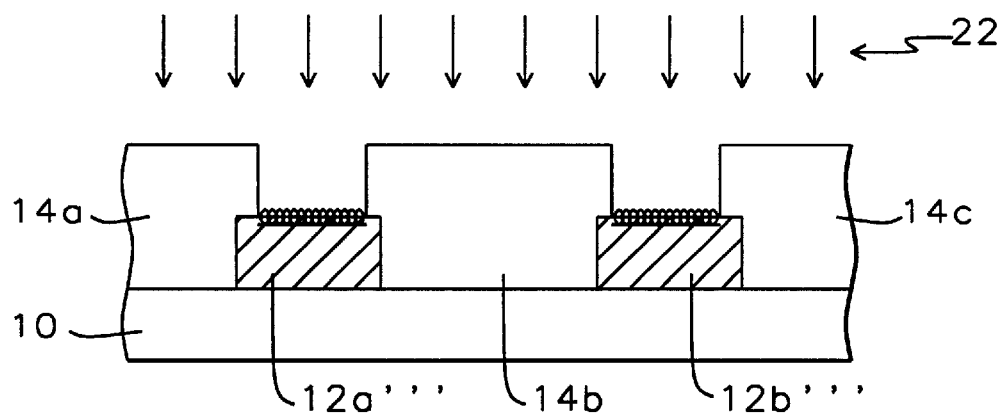

Referring now to FIG. 6, there is shown a schematic cross-sectional diagram illustrating the results of further processing of the microelectronic fabrication whose schematic cross-sectional diagram is illustrated in FIG. 5.

Although not specifically illustrated within the schematic cross-sectional diagram of FIG. 6, the microelectronic fabrication whose schematic cross-sectional diagram is illustrated in FIG. 5 is typically and preferably, although not necessarily, further treated with an additional wet chemical stripping solvent, more typically and preferably a chlorine containing organic solvent wet chemical stripping solvent, to ensure complete removal of any residues from the patterned photoresist layers 16a, 16b or 16c, or any oxygen containing plasma etch residues resulting from the first oxidizing plasma 20 etching of the patterned photoresist layers 16a, 16b and 16c. Similarly, such a chlorine containing organic solvent wet chemical stripping solvent in the absence of the oxide surface layers formed upon the oxidized inert plasma treated patterned conductor layers 12a" and 12b" would otherwise corrode the oxidized inert plasma treated patterned conductor layers 12a" and 12b". Such chlorine containing organic solvent wet chemical stripping solvents may be selected from the group including but not limited to perchlorocarbons (such as but not limited to carbon tetrachloride, hexachloroethane and perchloroethylene) and hydrochlorocarbons (such as but not limited to chloroform, dichloromethane, chloromethane, trichloroethane and trichloroethylene). Typically and preferably, the chlorine containing organic solvent wet chemical stripping solvent is employed at an elevated temperature of from about 90 to about 110 degrees centigrade for a time period of from about 5 to about 15 minutes to completely strip from the corresponding series of patterned dielectric passivation layers 14a, 14b and 14c any remaining residues of the patterned photoresist layers 16a, 16b and 16c or the first oxidizing plasma 20 treatment of the patterned photoresist layers 16a, 16b and 16c.

Shown also more specifically within the schematic cross-sectional diagram of FIG. 6 is a pair of twice oxidized inert plasma treated patterned conductor layers 12a''' and 12b''' which are formed from the pair of oxidized inert plasma treated patterned conductor layers 12a" and 12b" by optional further oxidizing of the oxidized inert plasma treated patterned conductor layers 12a" and 12b" within a second oxidizing plasma 22. Within the preferred embodiment of the present invention, the second oxidizing plasma 22, which is again optional but often typical and preferred, may be formed employing methods and materials as are employed in forming the first oxidizing plasma 20. It is at least in part the purpose of the second oxidizing plasma 22 to fully strip from the patterned dielectric passivation layers 14a, 14b and 14c and the oxidized inert plasma treated patterned conductor layers 12a" and 12b" any remaining or redistributed photoresist residues which are formed incident to treating the microelectronics fabrication whose schematic cross-sectional diagram is illustrated in FIG. 5 with the optional chlorine containing organic solvent wet chemical stripping solvent.

When oxidizing within the second oxidizing plasma 22 the pair of oxidized inert plasma treated patterned conductor layers 12a" and 12b" to form the pair of twice oxidized inert plasma treated patterned conductor layers 12a''' and 12b''' upon an eight inch diameter substrate, there is typically and preferably employed within the second oxidizing plasma 22: (1) a reactor chamber pressure of from about 0.5 to about 0.8 torr; (2) a radio frequency source power of from about 500 to about 700 watts at a source radio frequency of 13.56 MHz; (3) a substrate 10 temperature of from about 100 to about 200 degrees centigrade; and (4) an oxygen flow rate of from about 450 to about 600 standard cubic centimeters per minute (sccm).

Upon forming the microelectronic fabrication whose schematic cross-sectional diagram is illustrated in FIG. 6, there is formed a microelectronic fabrication having formed therein a pair of twice oxidized inert plasma treated patterned conductor layers 12a''' and 12b''' which have inhibited susceptibility to corrosion within a corrosive material when further fabricating the microelectronic fabrication whose schematic cross-sectional diagram is illustrated in FIG. 6.

Similarly, the pair of twice oxidized inert plasma treated patterned conductor layers 12a''' and 12b''' also has inhibited crystal defect formation and inhibited pit formation. The inhibited susceptibility to corrosion is effected by annealing the microelectronic fabrication within a first oxidizing plasma subsequent to or incident to stripping from the microelectronic fabrication a series of patterned photoresist layers. The inhibited crystal defect formation and inhibited pit formation is effected incident to an inert plasma treatment and/or aqueous ammonium hydroxide and hydrogen peroxide treatment of a pair of patterned conductor layers from which is derived the pair of twice oxidized inert plasma treated patterned conductor layers 12a''' and 12b''' prior to further processing of the pair of patterned conductor layers so treated when forming the pair of twice oxidized inert plasma treated patterned conductor layers 12a''' and 12b'''.

Figure 7:
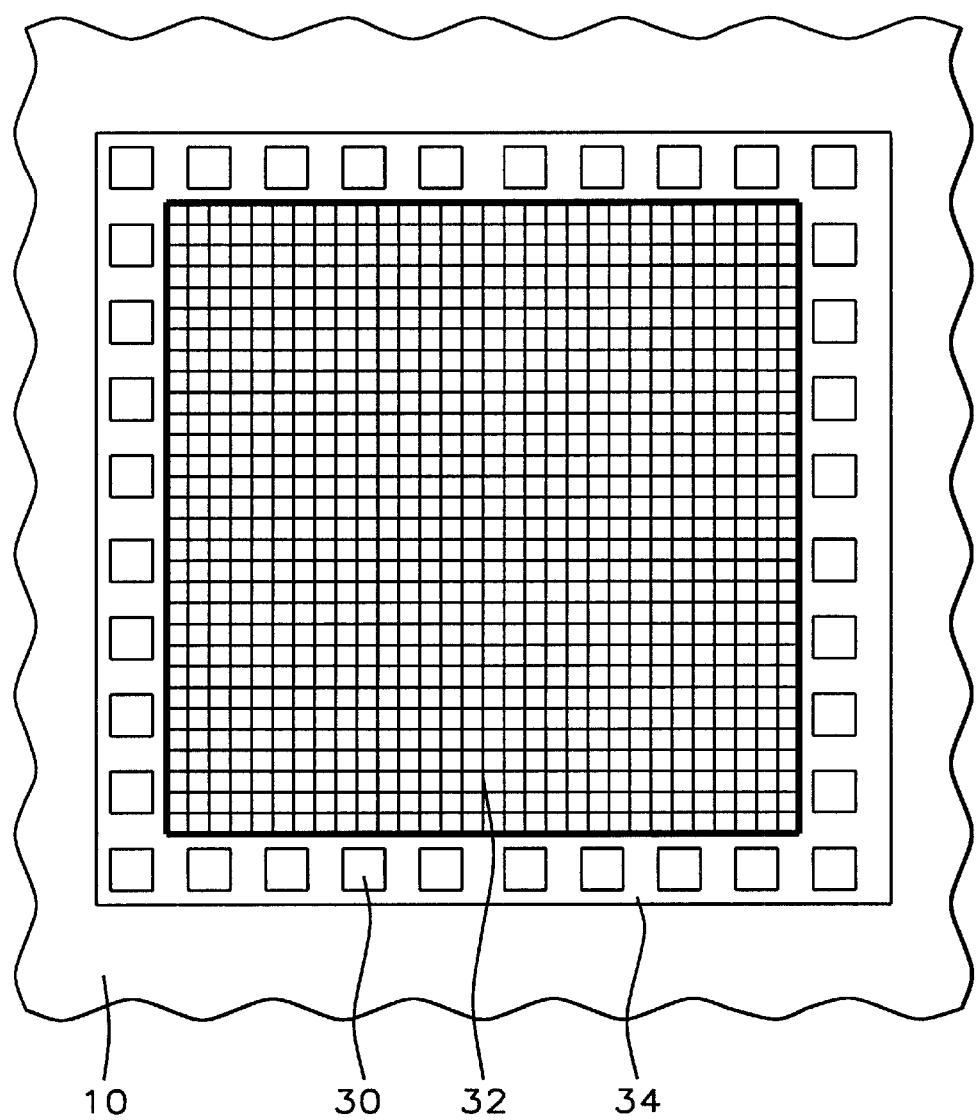
FIG. 7 shows a schematic plan view diagram illustrating an image array optoelectronic microelectronic fabrication having formed therein a series of bond pads comprised of patterned microelectronic conductor layers formed in accord with the preferred embodiment of the present invention.

Referring now to FIG. 7, there is shown a schematic plan-view diagram illustrating an image array optoelectronic microelectronic fabrication which may be formed incorporating the microelectronic fabrication whose schematic cross-sectional diagrams are illustrated within FIG. 1 to FIG. 6.

As is illustrated within the schematic plan-view diagram of FIG. 6, there is shown the substrate 10 having formed thereover an annular bond pad region 34 which encircles an image array region 32. Within the annular bond pad region 34 there is formed a plurality of bond pads 30. Each of the bond pads 30 may be formed employing methods and materials analogous or equivalent to the methods and materials as are employed for forming the oxidized inert plasma treated patterned conductor layers 12a'' and 12b'' or the twice oxidized inert plasma treated patterned conductor layers 12a''' and 12b''' as illustrated within the schematic cross-sectional diagrams of FIG. 1 to FIG. 6. Specifics of fabrication of individual pixels within the image array region 32 of the image array optoelectronic microelectronic fabrication whose schematic cross-sectional diagram is illustrated in FIG. 7 is provided within the related co-assigned applications which are referenced within the above Cross-Reference to Related Applications, the teachings of all of which related applications are, again, incorporated herein fully by reference.

Particularly significant to the present invention is the application of the present invention to formation of an image array optoelectronic microelectronic fabrication analogous or equivalent to the image array optoelectronic microelectronic fabrication whose schematic cross-sectional diagram is illustrated in FIG. 7, insofar as within such an image array optoelectronic microelectronic fabrication it is preferred to form an annular bond pad region, such as the annular bond pad region 34 as illustrated within the schematic plan-view diagram of FIG. 7, prior to fabricating an image array region, such as the image array region 32 as illustrated within the schematic cross-sectional diagram of FIG. 7. Similarly, when fabricating the image array region 32 of the image array optoelectronic microelectronic fabrication whose schematic cross-sectional diagram is illustrated in FIG. 7, there is typically and preferably employed up to at least about six photolithographic process cycles which provide: (1) six sequential exposures to hexamethyldisilazane (HMDS) as a photoresist adhesion promoter; (2) six photoresist layer deposition process steps; and (3) six photoresist development and stripping process steps which typically and preferably employ, at least in part, at least one of a chlorinated solvent photoresist developer or a chlorinated solvent photoresist stripper, which would otherwise corrode bond pads, such as the bond pads 30. It is noted that hexamethyldisilazane would also otherwise corrode bond pads 30.

Thus, by employing when forming the bond pad region 34 of the image array optoelectronic microelectronic fabrication whose schematic cross-sectional diagram is illustrated in FIG. 7 either: (1) the sequential aqueous ethanolamine stripper treatment and oxygen containing plasma treatment for forming a series of oxidized patterned conductor layers which forms the series of bond pads 30, or alternatively; (2) only the oxygen containing plasma treatment for forming the series of oxidized patterned conductor layers which form the bond pads 30, either of which in conjunction with; (3) an optional inert plasma treatment to form a series of oxidized inert plasma treated patterned conductor layers which form the bond pads 30, the bond pads 30 are formed with, in addition to enhanced corrosion resistance, enhanced bondability as evidenced by shear force for delamination of a bond wire bonded upon the bond pad.

EXAMPLES

There was obtained a series of six inch diameter semiconductor substrates and formed over each semiconductor substrate within the series of six inch diameter semiconductor substrates was a series of patterned conductor layers formed of an aluminum-copper alloy conductor material to a thickness of about 8000 angstroms each. There was then formed over each of the semiconductor substrates and covering each series of patterned conductor layers a blanket dielectric passivation layer formed of a composite of a silicon oxide dielectric layer of thickness about 2000 angstroms having formed thereupon a silicon nitride layer of thickness about 7000 angstroms. Finally, there was formed upon each of the blanket dielectric passivation layers a patterned photoresist layer formed to a thickness of about 35000 angstroms to define a series of apertures corresponding with the locations of the series of patterned conductor layers.

Each of the blanket dielectric passivation layers was then etched, while employing a corresponding patterned photoresist layer as an etch mask layer, and while employing a fluorine containing plasma etch method, to form a patterned dielectric passivation layer which had formed therethrough a series of vias accessing the patterned conductor layers. The fluorine containing plasma etch method employed: (1) a reactor chamber pressure of about 0.35 torr; (2) a radio frequency source power of about 700 watts at a source radio frequency of 13.56 MHZ; (3) a semiconductor substrate temperature of about zero degrees centigrade; (4) a carbon tetrafluoride flow rate of about 80 standard cubic centimeters per minute (sccm); and (5) an argon flow rate of about 250 standard cubic centimeters per minute (sccm), for a time period of about 40 seconds which was needed to completely clear the series of patterned conductor layers.

A first semiconductor substrate within the group of semiconductor substrates then received an argon inert plasma treatment in accord with the preferred embodiment of the present invention. The argon inert plasma treatment employed: (1) a reactor chamber pressure of about 300 mtorr; (2) a radio frequency power of about 1300 watts without a bias power; (3) a semiconductor substrate temperature of about 50 degrees centigrade effected by a backside helium cooling pressure of about 12 torr; (4) an argon flow rate of about 400 standard cubic centimeters per minute (sccm); and (5) a treatment time of about 20 seconds.

A second semiconductor substrate within the group of semiconductor substrates then received an aqueous ammonium hydroxide and hydrogen peroxide treatment similarly in accord with the preferred embodiment of the present invention. The aqueous ammonium hydroxide and hydrogen peroxide treatment was provided employing: (1) a solution comprising 28% ammonium hydroxide, 30% hydrogen peroxide and deionized water at a volume ratio of about 1:1:5; (2) a temperature of about 23 degrees centigrade and an immersion treatment time of about 3 minutes. After the aqueous ammonium hydroxide and hydrogen peroxide treatment, the second semiconductor substrate was then treated employing an argon inert plasma treatment method similarly with the first semiconductor substrate.

A third semiconductor substrate within the group of semiconductor substrates received no additional treatment.

Samples of both argon inert plasma treated bondpads upon the first semiconductor substrate and the non-argon inert plasma treated bondpads upon the third semiconductor substrate were then chemically analyzed by means of an ESCA analysis. For a series of bondpads which did not receive the argon inert plasma treatment there was observed a fluorine:oxygen:carbon:sulfur:aluminum intensity ratio of 13.1:40.5:9.0:0.5:37.1, and for a series of bondpads which received the argon inert plasma treatment there was observed a corresponding fluorine:oxygen:carbon:sulfur:aluminum intensity ratio of 6.7:39.0:9.9:0.0:26.1. As is observed incident to comparison of the foregoing ratios, there was found significantly less fluorine within the series of argon inert plasma treated bond pads.

The first semiconductor substrate, the second semiconductor substrate and the third semiconductor substrate were then placed in a controlled environment test chamber at a temperature of about 22.5 degrees centigrade and a humidity of about 90 percent. There was then observed via optical microscopic analysis formation of crystal defects and pits within bond pads not subject to the argon inert plasma treatment or ammonium hydroxide and hydrogen peroxide treatment within about three days, whereas within bond pads which were subject to either the argon plasma treatment or the ammonium hydroxide and hydrogen peroxide treatment there was no observation of crystal defects and pits within about eight days.

The patterned photoresist layers remaining upon a fourth semiconductor substrate was then stripped employing a chlorine containing organic solvent wet chemical stripping solvent at a temperature of about 105 degrees centigrade for an immersion time of about 15 minutes. The chlorine containing organic solvent wet chemical stripping solvent was followed by an oxygen plasma treatment for a time period of about 4200 seconds, where the oxygen plasma treatment also employed: (1) a reactor chamber pressure of about 500 torr; (2) a radio frequency source power of about 1500 watts at a source radio frequency of 13.56 MHz; (3) a semiconductor substrate temperature of about 120 degrees centigrade; and (4) an oxygen flow rate of about 500 standard cubic centimeters per minute (sccm).

The patterned photoresist layer remaining upon a fifth semiconductor substrates was then stripped employing a method analogous to the method employed for stripping the patterned photoresist layer remaining upon the fourth of the semiconductor substrates, but wherein there was interposed between the chlorine containing organic solvent wet chemical stripping solvent stripping and the oxygen plasma treatment a carbon tetrafluoride plasma stripping which is believed to reduce residual chlorine containing species formed upon the series of patterned conductor layers incident to the chlorine containing organic solvent wet chemical stripping solvent stripping.

The carbon tetrafluoride plasma stripping also employed: (1) a reactor chamber pressure of about 0.88 torr; (2) a radio frequency source power of about 75 watts at a source radio frequency of 13.56 MHZ; and (3) a carbon tetrafluoride flow rate of about 100 standard cubic centimeters per minute (sccm).

The patterned photoresist layer remaining upon a sixth semiconductor substrates was then stripped employing a method analogous to the method employed for stripping the series of patterned photoresist layers remaining upon the fourth of the semiconductor substrates, but wherein there was added, in accord with the preferred embodiment of the present invention, an oxygen plasma treatment prior to completely stripping the patterned photoresist layer while employing the chlorine containing organic solvent wet chemical stripping solvent.

The oxygen plasma treatment employed: (1) a reactor chamber pressure of about 0.5 torr; (2) a radio frequency source power of about 700 watts at a source radio frequency of 13.56 MHZ; (3) a semiconductor substrate temperature of about 150 degrees centigrade; (4) an oxygen flow rate of about 700 standard cubic centimeters per minute (sccm); and (5) an exposure time of about 4200 seconds.

Each of the fourth, fifth and sixth semiconductor substrates from which was stripped the remaining patterned photoresist layers was then exposed to an ambient environment at a relative humidity of about 50 percent and a temperature of about 25 degrees centigrade, and there was then measured via unaided visual observation a percentage of the bond pads which had corrosion products formed thereupon. There was also measured for the fifth semiconductor substrate and for the sixth semiconductor substrate a thickness of an oxide layer formed upon the patterned aluminum containing conductor layers. The measured thicknesses for the oxide layers were about 65 angstroms with respect to the fifth semiconductor substrate and about 55 angstroms with respect to the sixth semiconductor substrate. The measured results with respect to corrosion of bond pads are reported in Table I.

TABLE I

| | Percentage Corroded Bond Pads | | |
|---|---|---|---|
| Exposure Time | solvent/O2 | solvent/CF4/O2 | O2/solvent/O2 |
| 6 hours | 20 | 0 | 0 |
| 24 hours | 100 | 0 | 0 |
| 48 hours | 100 | 0 | 0 |

As is seen from review of the data within Table I, there is observed while employing the method of the present invention a significant reduction in bond pad corrosion in comparison with an otherwise analogous photoresist stripping method which does not employ a preliminary oxygen plasma bond pad oxidation in accord with the present invention. Alternatively viewed, review of the data within Table I provides that a photoresist stripping method which employs an oxygen plasma stripping method followed by a chlorine containing organic solvent wet chemical stripping method provides lesser susceptibility for bond pad corrosion in comparison with a photoresist stripping method which employs a chlorine containing organic solvent wet chemical stripping method followed by an oxygen plasma stripping method.

There was obtained an additional series of six inch diameter semiconductor substrates which were fabricated generally equivalently to the first series of semiconductor substrates, up to and including forming the series of vias through the dielectric passivation layers to reach the series of patterned conductor layers while employing the series of patterned photoresist layers as the series of photoresist etch mask layers. Within the additional series of six inch diameter semiconductor substrates, the patterned conductor layers were patterned conductor bond pad layers and the semiconductor substrates were employed within a series of image array optoelectronic fabrications. Various of the additional semiconductor substrates received an argon inert plasma treatment in accord with the first semiconductor substrate within the first series of semiconductor substrates and/or an ammonium hydroxide and hydrogen peroxide treatment in accord with the second semiconductor substrate within the first series of semiconductor substrates. A remaining four of the additional series of semiconductor substrates did not. A semiconductor substrate which received an argon inert plasma treatment was then paired with a semiconductor substrate which did not receive the argon inert plasma treatment to thus provide four pair of semiconductor substrates.

Within two pair of the four pair of semiconductor substrates, the patterned photoresist layers were then stripped employing an aqueous ethanolamine stripping solution only.

Within the remaining two pair of four pair of semiconductor substrates the patterned photoresist layers were stripped employing the aqueous ethanolamine stripping solution as employed for stripping the patterned photoresist layer from upon the first two pair of semiconductor substrates, and then followed by an oxygen containing plasma oxidation of the bond pads in accord with the preferred embodiment of the present invention.

One of the pair semiconductor substrates from which the patterned photoresist layer was stripped only, without additional oxidation of the exposed bond pads, received no further treatment. A second of the pair semiconductor substrates from which the patterned photoresist layer was stripped only, without further oxidation of the exposed bond pads, was then employed within a standard color filter image array optoelectronic microelectronic fabrication process which employed six cycles of: (1) a hexamethyldisilazane treatment; (2) a photoresist developer solution exposure; and (3) a photoresist stripper solution exposure. A third of the four pair of semiconductor substrates from which the patterned photoresist layer was stripped and the exposed bond pads were additionally oxidized employing the oxygen containing plasma was then employed within the standard color filter image array optoelectronic microelectronic fabrication process as employed for further fabricating the second semiconductor substrate. Finally, a fourth of the four pair of semiconductor substrates from which the patterned photoresist layer was stripped and the exposed bond pads were additionally oxidized employing the oxygen containing plasma was then employed within a color filter image array optoelectronic microelectronic fabrication process otherwise equivalent to the color filter image array optoelectronic microelectronic fabrication process employed for further fabricating of the third of the semiconductor substrates, but where there was employed twenty cycles of the hexamethyldisilazane exposure, photoresist developer exposure and photoresist stripper exposure, rather than six cycles.

Upon the bond pads upon each of the eight semiconductor substrates was then bonded a series of 1.2 mil diameter gold bonding wires while employing an otherwise standard ball bonding method employing: (1) a bonding current of 125 milliamperes; (2) a bonding time of about 15 milliseconds; (3) a bonding force of about 30 grams; (4) a bonding temperature of about 230 degrees; and (5) a bonding ball size of about 3.0 mils. The bonding wires which were thus ball bonded to the bond pads were then tested while employing a ball shear test method. Average ball shear values for the bonding wires which were ball bonded to the bond pads are reported in Table II, as below, as a function of bond pad processing.

TABLE II

| Sample | Bond Pad Processing | Average Ball Shear |
|---|---|---|
| 1 | Std P/R Strip - No color filter | 45 grams |
| 2 | Samp 1 w/30 sec Ar Plasma | 41 |
| 3 | Samp 1 w/60 sec Ar Plasma | 43 |
| 4 | Samp 1 w/180 sec APM | 34 |
| 5 | Samp 1 w/300 sec APM | 32 |
| 6 | Samp 1 w/420 sec APM | 28 |
| 7 | Samp 1 w/120 sec APM + 30 sec Ar Plasma | 44 |
| 8 | Samp 1 w/30 sec Ar + 90 sec APM + 30 sec Ar | 42 |
| 9 | Std P/R Strip - Std 6X color filter | 29 |
| 10 | Samp 9 w/30 sec Ar Plasma | 44 |
| 11 | P/R Strip + O2 Plasma - Std 6X color filter | 44 |
| 12 | Samp 11 w/30 sec Ar Plasma | 43 |
| 13 | P/R Strip + O2 Plasma - 20X color filter | 36 |
| 14 | Samp 13 w/30 sec Ar Plasma | 45 |

As is seen from review of the data within Table II, there is observed a substantial decrease in bond wire ball shear strength for a bond wire bonded upon a bond pad which has been exposed to a series of standard color filter image array processing steps. However, when employing the method of the present invention, which provides an oxygen containing plasma treatment of a bond pad, a ball shear strength of a bond wire bonded to the bond pad does not decrease substantially when bonded upon a bond pad which has been exposed to standard color filter image array processing steps. Similarly, a bond strength of such a bond wire decreases only moderately when bonded upon a bond pad which has been exposed to an extended number of standard color filter image array processing steps. Similarly, as is also seen from review of the data within Table II there is generally observed an increase in bond wire ball shear strength for a bond wire ball bonded onto a bond pad which has received an argon inert plasma treatment in accord with the present invention. Finally, as is also seen from review of the data within Table II, while an ammonium hydroxide and hydrogen peroxide treatment of a bond pad may attenuate crystalline defect formation and pit formation within the bond pad, an extended ammonium hydroxide and hydrogen peroxide treatment of a bond pad, absent a remediating plasma treatment of the bond pad, will provide for decreased bondability of a bond wire onto the bond pad.

As is understood by a person skilled in the art, the preferred embodiment of the present invention is illustrative of the present invention rather than limiting of the present invention. Revisions and modifications may be made to methods, materials, structures and dimensions through which is fabricated a microelectronic fabrication in accord with the preferred embodiment of the present invention, while still providing a microelectronic fabrication in accord with the present invention, as defined by the appended claims.

What is claimed is:

1. A method for passivating a target layer comprising:
   providing a substrate;
   forming over the substrate a target layer, the target layer being susceptible to corrosion incident to contact with a corrosive material employed for further processing of the substrate; the target layer being a conductor layer; the corrosive material being selected from the group consisting of hexamethyldisilazane and a chlorinated solvent;

treating, while employing a first plasma method employing a first plasma gas composition comprising an oxidizing gas, the target layer to form an oxidized target layer having an inhibited susceptibility to corrosion incident to contact with the corrosive material employed for further processing of the substrate; and processing further, while employing the corrosive material, the substrate; the oxidizing gas being selected from the group consisting of ozone, nitrous oxide and nitric oxide.

2. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The method of claim 1 further comprising treating the target layer with a solvent prior to treating the substrate while employing the first plasma method.

4. The method of claim 3 wherein the solvent is an aqueous ethanolamine solvent.

5. A method for stripping a photoresist layer comprising:
providing a substrate;
forming over the substrate a target layer and a photoresist layer, the target layer being susceptible to corrosion incident to contact with a solvent employed for stripping the photoresist layer from over the substrate; the target layer being a conductor layer; the solvent being a chlorinated solvent;
treating, while employing a first plasma method employing a first plasma gas composition comprising an oxidizing gas, the target layer to form an oxidized target layer having an inhibited susceptibility to corrosion incident to contact with the solvent employed for stripping the photoresist layer from over the substrate; the oxidizing gas is selected from the group consisting of oxygen, ozone, nitrous oxide and nitric oxide; and
stripping, while employing the solvent, the photoresist layer from over the substrate.

6. The method of claim 5, wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

7. A method for forming a conductor layer contact comprising:
providing a substrate;
forming over the substrate a conductor layer; the conductor layer is formed from a conductor material selected from the group consisting of aluminum, aluminum alloy, copper and copper alloy conductor materials;
forming upon the conductor layer a blanket dielectric passivation layer;
forming upon the blanket dielectric passivation layer a patterned photoresist layer which defines a location of a via to be formed through the blanket dielectric passivation layer to access the conductor layer, the conductor layer being susceptible to corrosion incident to contact with a solvent employed for stripping the patterned photoresist layer from a patterned dielectric passivation layer formed from the blanket dielectric passivation layer; the solvent being a chlorinated solvent;
etching, while employing a first plasma etch method and the patterned photoresist layer as an etch mask layer, the blanket dielectric passivation layer to form the patterned dielectric passivation layer defining the via accessing the conductor layer;
treating, while employing a second plasma method employing a second plasma gas composition comprising an oxidizing gas, an exposed portion of the conductor layer within the via to form an oxidized conductor layer having an inhibited susceptibility to corrosion incident to contact with the solvent employed for stripping the patterned photoresist layer from the patterned dielectric passivation layer; the oxidizing gas being selected from the group consisting of oxygen, ozone, nitrous oxide and nitric oxide; and
stripping, while employing the solvent, the patterned photoresist layer from the patterned dielectric passivation layer.

8. The method of claim 7, wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

9. The method of claim 7, wherein the portion of the conductor layer exposed within the via forms a bond pad.

10. The method of claim 7, further comprising treating, while employing a third plasma method employing a third plasma gas composition comprising a third oxidizing gas, the oxidized conductor layer to form a twice oxidized conductor layer, after stripping, while employing the solvent, the patterned photoresist layer from the patterned dielectric passivation layer.

11. A method for forming a conductor layer comprising:
providing a substrate;
forming over the substrate a conductor layer;
treating the conductor layer with a first plasma comprising an etchant gas composition which upon plasma activation provides an active fluorine containing etchant species to form from the conductor layer a first plasma treated conductor layer; and
treating the first plasma treated conductor layer with at least one of:
an inert plasma; and
an ammonium hydroxide and hydrogen peroxide solution, to form from the first plasma treated conductor layer a further treated first plasma treated conductor layer.

12. The method of claim 11 wherein by treating the first plasma treated conductor layer with the at least one of the inert plasma and the ammonium hydroxide and hydrogen peroxide solution to form the further treated first plasma treated conductor layer, the further treated first plasma treated conductor layer is formed with attenuated crystal defects, attenuated pits and enhanced bondability in comparison with the first plasma treated conductor layer.

13. The method of claim 11 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

14. The method of claim 11, wherein the conductor layer is an aluminum containing conductor layer.

15. The method of claim 11 further comprising treating the further treated first plasma treated conductor layer with an aqueous ethanolamine solution to form an ethanolamine treated further treated first plasma treated conductor layer.

16. The method of claim 15 further comprising treating the ethanolamine treated further treated first plasma treated conductor layer with an oxidizing plasma to form an oxidized ethanolamine treated further treated first plasma treated conductor layer.

\* \* \* \* \*